(12) United States Patent
Melanson

(10) Patent No.: US 7,196,647 B2
(45) Date of Patent: *Mar. 27, 2007

(54) SIGNAL PROCESSING WITH LOOK-AHEAD MODULATOR NOISE QUANTIZATION MINIMIZATION

(75) Inventor: John L. Melanson, Asutin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/900,877

(22) Filed: Jul. 28, 2004

(65) Prior Publication Data

US 2005/0156766 A1   Jul. 21, 2005

Related U.S. Application Data

(60) Provisional application No. 60/539,132, filed on Jan. 26, 2004, provisional application No. 60/537,285, filed on Jan. 16, 2004.

(51) Int. Cl.
*H03M 3/00* (2006.01)

(52) U.S. Cl. ...................... 341/143; 341/118

(58) Field of Classification Search ........ 341/143, 341/144, 145, 155, 157, 126, 118, 120, 131; 330/282; 358/463; 455/192.2; 704/222, 704/243, 230; 375/262, 222, 240.24, 240.14, 375/240.22, 247; 382/107, 251
See application file for complete search history.

(56) References Cited

U.S. PATENT DOCUMENTS

| | | | |
|---|---|---|---|
| 5,548,286 A | 8/1996 | Craven | 341/144 |
| 5,550,544 A | 8/1996 | Sakiyama et al. | 341/155 |
| 5,585,801 A | 12/1996 | Thurston | 341/143 |
| 5,598,159 A | 1/1997 | Hein | 341/143 |
| 5,708,433 A | 1/1998 | Craven | 341/144 |
| 5,742,246 A | 4/1998 | Kuo et al. | 341/143 |

(Continued)

FOREIGN PATENT DOCUMENTS

EP   0512687   11/1992

(Continued)

OTHER PUBLICATIONS

J. Paulos et al., "Improved Signal-To-Noise Ratio Using Tri-Level Delta-Sigma Modulation," Reprinted from IEEE Proc. ISCAS, May 1987, pp. 245-248, no date.

(Continued)

*Primary Examiner*—Howard Williams
(74) *Attorney, Agent, or Firm*—Hamilton & Terrile, LLP; Kent B. Chambers

(57) ABSTRACT

A signal processing system includes a look-ahead delta-sigma modulator that processes multiple output candidate vectors and an input vector to determine a quantization error vector for each output candidate vector. In one embodiment, the quantization error vector represents a difference between a cost value vector and an input candidate vector. Look-ahead delta-sigma modulator output values are selected using the quantization error vectors by, for example, determining the minimum power quantization error vector for each input vector X and selecting the output value from the input candidate vector associated with the minimum power quantization error vector. Quantization error vectors can also be weighted using a non-uniform weighting vector.

56 Claims, 12 Drawing Sheets

U.S. PATENT DOCUMENTS

| | | | |
|---|---|---|---|
| 5,757,300 | A | 5/1998 | Koilpillai et al. |
| 5,757,517 | A | 5/1998 | Couwenhoven et al. .... 358/463 |
| 5,786,779 | A | 7/1998 | Chun et al. |
| 5,977,899 | A | 11/1999 | Adams et al. .............. 341/145 |
| 6,067,515 | A * | 5/2000 | Cong et al. ................. 704/243 |
| 6,070,136 | A * | 5/2000 | Cong et al. ................. 704/222 |
| 6,112,218 | A | 8/2000 | Gandhi et al. |
| 6,160,505 | A | 12/2000 | Vaishampayan ............ 341/143 |
| 6,177,897 | B1 | 1/2001 | Williams, III |
| 6,232,899 | B1 | 5/2001 | Craven ....................... 341/126 |
| 6,271,781 | B1 * | 8/2001 | Pellon ........................ 341/143 |
| 6,310,518 | B1 | 10/2001 | Swanson .................... 330/282 |
| 6,313,773 | B1 | 11/2001 | Wilson et al. |
| 6,347,297 | B1 * | 2/2002 | Asghar et al. .............. 704/243 |
| 6,362,769 | B1 * | 3/2002 | Hovin et al. ................ 341/157 |
| 6,373,416 | B1 * | 4/2002 | McGrath .................... 341/143 |
| 6,392,576 | B1 | 5/2002 | Wilson et al. .............. 341/143 |
| 6,418,172 | B1 | 7/2002 | Raghavan et al. .......... 375/262 |
| 6,473,017 | B1 * | 10/2002 | Nguyen ...................... 341/143 |
| 6,480,129 | B1 | 11/2002 | Melanson ................... 341/143 |
| 6,480,528 | B1 | 11/2002 | Patel et al. |
| 6,501,404 | B2 * | 12/2002 | Walker ....................... 341/143 |
| 6,590,512 | B2 | 7/2003 | Roh et al. ................... 341/143 |
| 6,639,531 | B1 | 10/2003 | Melanson |
| 6,724,332 | B1 | 4/2004 | Melanson |
| 6,760,573 | B2 | 7/2004 | Subrahmanya et al. .. 455/192.2 |
| 6,822,594 | B1 | 11/2004 | Melanson et al. .......... 341/143 |
| 6,842,128 | B2 | 1/2005 | Koh |
| 6,842,486 | B2 | 1/2005 | Plisch et al. |
| 6,861,968 | B2 | 3/2005 | Melanson |
| 6,873,278 | B1 | 3/2005 | Ferguson et al. ........... 341/144 |
| 6,873,280 | B2 | 3/2005 | Robinson et al. |
| 6,879,275 | B1 * | 4/2005 | Melanson ................... 341/143 |
| 6,888,484 | B2 | 5/2005 | Kiss et al. |
| 6,933,871 | B2 | 8/2005 | Melanson |
| 6,940,434 | B2 | 9/2005 | Brooks ....................... 341/131 |
| 6,956,514 | B1 | 10/2005 | Melanson et al. .......... 341/143 |
| 6,967,606 | B2 | 11/2005 | Wiesbauer et al. ......... 341/143 |
| 7,009,543 | B2 * | 3/2006 | Melanson ................... 341/143 |
| 2003/0086366 | A1 | 5/2003 | Branlund et al. ........... 370/208 |
| 2003/0231729 | A1 | 12/2003 | Chien et al. ................ 375/376 |
| 2005/0012649 | A1 | 1/2005 | Adams et al. .............. 341/143 |
| 2005/0052300 | A1 | 3/2005 | Ranganathan ............... 341/143 |

FOREIGN PATENT DOCUMENTS

| | | |
|---|---|---|
| EP | 1227595 | 7/2002 |
| JP | 2003-124812 | 4/2003 |

OTHER PUBLICATIONS

E. Knapen et al., "Lossless Compression of 1-Bit Audio," J. Audio Eng. Soc., vol. 52, No. 3, Mar. 2004, pp. 190-199, no date.

Angus, James A.S., "Tree Based Lookahead Sigma Delta Modulators," Audio Engineering Society 114th Convention, Convention Paper 5825, Mar. 22-25, 2003.

Harpe, Pieter, et al., "Efficient Trellis-Type Sigma Delta Modulator," Audio Engineering Society 114th Convention, Convention Paper 5845, Mar. 22-25, 2003.

Hawksford, M.O.J., "Parametrically Controlled Noise Shaping in Variable State-Step-Back Pseudo-Trellis SDM," Audio Engineering Society 115th Convention, Convention Paper, Oct. 10-13, 2003.

Kato, Hiroshi, "Trellis Noise-Shaping Converters and 1-bit Digital Audio," Audio Engineering Society 112th Convention, Convention Paper 5615, May 10-13, 2002.

Sony Electronics, Inc. and Philips Electronics N.V., "Super Audio Compact Disc, A Technical Proposal," 1997, no month.

Zetterberg, L.H. et al., "Adaptive Delta Modulation with Delayed Decision," IEEE Transactions on Communications, IEEE vol. COM-22, No. 9, Sep. 1974, pp. 1195-1198, no date.

Stonick, J.T. et al., "Look-Ahead Decision-Feedback $\Sigma\Delta$ Modulation," IEEE International Conference on Acoustics, Speech and Signal Processing, New York, 1994, no month.

Abeysekera, S. et al., "Design of Multiplier Free FIR Filters Using a LADF Sigma-Delta Modulator," Circuits and Systems, 2000, Proceedings, ISCAS 2000 Geneva, The 2000 IEEE International Symposium, May 28-31, 2000, vol. 2, May 28, 2000, pp. 65-68.

Abeysekera, S.S. et al., "Performance Evaluation of 3rd Order Sigma-Delta Modulators via FPGA Implementation," ASIC/SOC Conference, 2001, Proceedings, 14th Annual IEEE International Sep. 12-15, 2001, pp. 13-17.

Magrath, A.J. et al., "Performance Enhancement of Sigma-Delta Modulator D-A Converters Using Non-Linear Techniques," 1996 IEEE Symposium on Circuits and Systems (ISCAS), vol. 2, May 12, 1996, pp. 277-280.

Magrath, A.J. et al., "Non-Linear Deterministic Dithering of Sigma-Delta Modulators," IEE Colloquium on Oversampling and Sigma Delta Strategies for DSP, 1995, pp. 1-6, no month.

Lindfors, S., "A Two-Step Quantization $\Delta\Sigma$-Modulator Architecture with Cascaded Digital Noise Cancellation," Electronics, Circuits and Systems, 2000, ICECS, The 7th IEEE International Conference, Dec. 17-20, 2000, vol. 1, pp. 125-128.

Harris, F.J. et al., "Implementation Considerations and Limitations for Dynamic Range Enhanced Analog to Digital Converters," IEEE International Conference on Acoustics, Speech and Signal Processing, May 23, 1989, pp. 1286-1289.

Fang, L. et al., "A Multi-Bit Sigma-Delta Modulator with Interstate Feedback," Circuits and Systems, 1998, Proceedings of the 1998 IEEE International Symposium, May 31-Jun. 3, 1998, vol. 1, pp. 583-586.

* cited by examiner

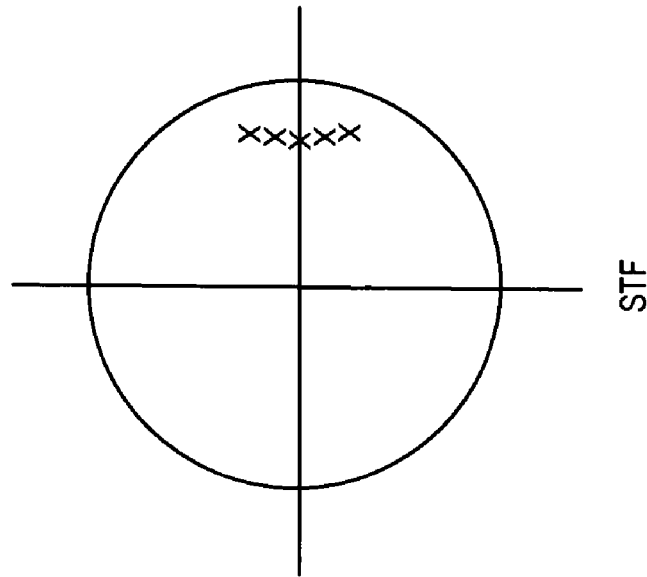
Figure 3D *(prior art)*
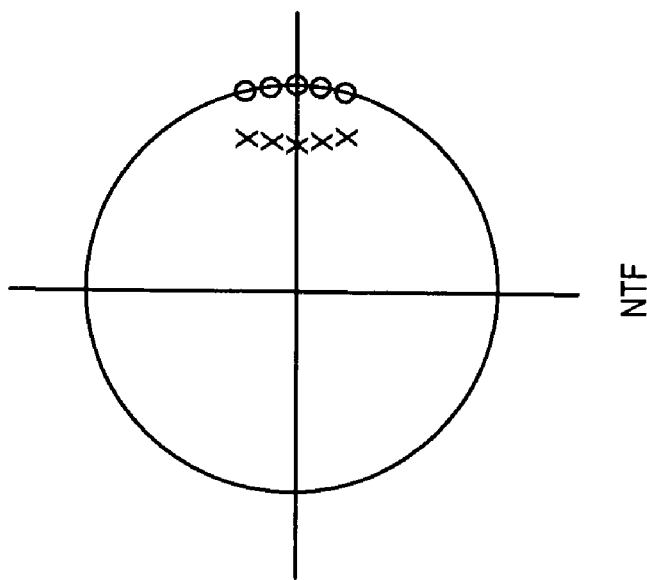
Figure 3C *(prior art)*

SIGNAL PROCESSING WITH LOOK-AHEAD MODULATOR NOISE QUANTIZATION MINIMIZATION

CROSS-REFERENCE TO RELATED APPLICATION

This application claims the benefit under 35 U.S.C. § 119(e) of (i) U.S. Provisional Application No. 60/537,285, filed Jan. 16, 2004 and entitled "Look-Ahead Delta-sigma Modulators" and (ii) U.S. Provisional Application No. 60/539,132, filed Jan. 26, 2004 and entitled "Signal Processing Systems with Look-Ahead Delta-Sigma Modulators". Both provisional applications include example systems and methods and are incorporated by reference in their entireties.

This application claims the benefit under 35 U.S.C. § 120 of commonly assigned U.S. Patent application entitled "Signal Processing with a Look-ahead Modulator Having Time Weighted Error Values", Ser. No. 10/875,920, filed on Jun. 22, 2004, now U.S. Pat. No. 6,879,275, issued Apr. 12, 2005, inventor John L. Melanson (referred to herein as the "Melanson Weighting Patent"). The Melanson Weighting Patent describes examples of systems and methods for weighting look-ahead delta-sigma modulator error vectors and is hereby incorporated by reference in its entirety.

BACKGROUND OF THE INVENTION

1. Field of the Invention

The present invention relates to signal processing and more particularly relates to look-ahead delta-sigma modulators having quantization error based output selection to minimize quantization noise.

2. Description of the Related Art

A few signal processing systems implement look-ahead delta-sigma modulators in an attempt to obtain superior input/output signal fidelity by minimizing long term error. "Delta-sigma modulators" are also commonly referred to using other interchangeable terms such as "sigma-delta modulators", "delta-sigma converters", "sigma delta converters", and "noise shapers". FIG. 1 depicts a prior art signal processing system 100 having a look-ahead delta-sigma modulator 102.

The signal source 102 provides an input signal to preprocessing components 104. Preprocessing components include an analog-to-digital converter ("ADC") and oversampling components to generate a k-bit, digital input signal x(n). For audio applications, x(n) generally represents a signal sampled at 44.1 kHz times an oversampling ratio, such as 64:1. Look-ahead modulator 106 quantizes input signal x(n) and shapes the quantization noise so that most of the quantization noise is moved out of the signal band of interest, e.g. approximately 0–20 kHz for audio applications. Each output signal y(n) (also referred to herein as an "output value") generally has one of two values selected from the set $\{+\Delta/2, -\Delta/2\}$ with "$\Delta$" representing the full swing of y(n). (For convenience, $\Delta/2$ will be represented as +1, and $-\Delta/2$ will be represented as −1.). The output signal y(n) can be processed further and, for example, used to drive an audio sound system or can be recorded directly onto a storage medium.

FIG. 2 depicts a schematic representation of prior art look-ahead delta-sigma modulator 106 with a look-ahead depth of M. Table 1 describes an embodiment of the symbols used in FIG. 2.

TABLE 1

| Symbol | Definition |
| --- | --- |
| x(n) | The nth discrete input signal. |
| $X_t$ | Input signal vector at a time t. |
| y(n) | The nth discrete output signal. |
| $Y_{Di}$ | The ith output delayed by one candidate vector. |
| $C_i$ | The ith cost value vector = $H(D_i(z))$. |
| M | Look-ahead depth. |
| N | $N = k^M$ = The number of output signal candidate sets under consideration, and k = number of possible values for y(n). |
| i | i is selected from the set $\{0, 1, 2, \ldots N-1\}$. |
| $C^{(2)}_i$ | The ith cost value power. |
| $C^{(2)}_{min}$ | The minimum cost value power at time t. |

The look-ahead depth M refers to the dimension of each delayed output candidate vector $Y_{Di}$ used to determine output signal y(n). For time t, a negative delayed output candidate vector $-Y_{Di}$, $i \in \{0,1,2, \ldots, N-1\}$ and the input vector $X_t$ are inputs to noise shaping filter 202(i). For a look-ahead depth of M and y(n)={−1, +1}, and without pruning output candidates, each of the N delayed output candidate vectors contains a unique set of elements. Each noise-shaping filter 202(i) of look-ahead delta-sigma modulator 106 uses a common set of filter state variables for time t during the calculations of respective cost value vectors $C_i$. Filter 202 maintains the actual filter state variables used during the calculation of each y(n). The state variables are updated with the selected y(n) output value. Loop filter 202 processes $X_i$ and $-Y_i$ to produce an error value, which in this embodiment is referred to as cost value vector $C_i$. Cost value vector $C_i$, and, thus, each element of cost value vector $C_i$ is a frequency weighted error value. In some embodiments of look-ahead delta-sigma modulator 106, input signal vector $x_t$ and delayed output candidate vectors $Y_{Di}$ are also used as direct inputs to filter 202(i)

Quantizer error and output generator 203 includes two modules to determine y(n). The cost function minimum search module 204 computes the cost value power, $C_i^{(2)}$, of each cost value vector $C_i$ in accordance with Equation 1, and determines the minimum cost value power at time t.

$$C_i^{(2)} = \sum_{t=1}^{t=M} [c_t]^2. \qquad \text{Equation 1}$$

"$c_t$" represents a cost value for time t, t=1 through M, in the cost vector $C_i$. Thus, the cost function minimum search module 204 of quantizer 203 attempts to minimize the energy out of loop filter 202. Minimizing the energy out of loop filter 202 effectively drives the input $C_i$ to a small value, which effectively results in a relatively high loop gain for look-ahead delta-sigma modulator 106 and, thus, modifies the noise shaping transfer function in an undesirable way.

The y(n) selector module 206 selects y(n) as the leading bit of $Y_i$ where $C_i^{(2)}{}_{min}$ represents the minimum cost value power.

For example, if M=2 and y∈{−1,+1}, then N=4, i∈{0,1,2,3}, and Table 2 represents each of the Y output candidate vectors and $X_t$.

TABLE 2

|       | $Y_1$ | $Y_2$ | $Y_3$ | $Y_4$ | $X_t$    |
|-------|-------|-------|-------|-------|----------|
| $y_t$     | 0     | 0     | 1     | 1     | x(n)     |
| $y_{t+1}$ | 0     | 1     | 0     | 1     | x(n + 1) |

If $c_3^{(2)}$ represents the minimum cost value power, then selector module 206 selects y(n)=1 because the first bit in output candidate vector $Y_3$ (the output candidate vector associated with $C_3^{(2)}$), equals 1. If $C_1^{(2)}$ represents the minimum cost value power, then selector module 206 selects y(n)=0 because the first bit in output candidate vector $Y_1$ (the output candidate vector associated with $C_1^{(2)}$), equals 0.

Conventional research in look-ahead modulators primarily involves two threads. The first are the works of Hiroshi Kato, "Trellis Noise-Shaping Converters and 1-bit Digital Audio," AES 112$^{th}$ Convention, 2002 May 10–13 Munich, and Hiroshi Kato, Japanese Patent JP, 2003-124812 A, and further refinements described in Harpe, P., Reefman D., Janssen E., "Efficient Trellis-type Sigma Delta Modulator," AES 114$^{th}$ Convention, 2003 Mar. 22–25 Amsterdam (referred to herein as "Harpe"); James A. S. Angus, "Tree Based Look-ahead Sigma Delta Modulators," AES 114$^{th}$ Convention, 2003 Mar. 22–25 Amsterdam; James A. S. Angus, "Efficient Algorithms for Look-Ahead Sigma-Delta Modulators," AES 155$^{th}$ Convention, 2003 Oct. 10–13 New York; Janssen E., Reefman D., "Advances in Trellis based SDM structures," AES 115$^{th}$ Convention, 2003 Oct. 10–13 New York. This research targets solving the problems of 1-bit encoding of audio data for storage without using the steep anti-alias filters associated with pulse code modulation "PCM." The advent of super audio compact disc "SACD" audio storage, with its moderate oversampling ratios (32 or 64), motivated this work.

The second primary thread of look-ahead modulator research involves pulse width modulation ("PWM") amplifiers based on delta-sigma modulators combined with digital PWM modulation stages. The principal researchers have been Peter Craven and John L. Melanson. In U.S. Pat. No. 5,784,017 entitled "Analogue and Digital Converters Using Pulse Edge Modulations with Non-Linear Correction," inventor Peter Craven ("Craven"), which is incorporated herein by reference in its entirety, Craven described the use of look-ahead in delta-sigma modulators. The purpose of Craven was to ensure stability in alternating edge modulation, an inherently difficult modulation mode to stabilize. In the PWM case, the delta-sigma modulator is operating at a low oversampling ratio (typically 4–16), and quantization noise is a special problem.

Conventional technology has not proposed a reasonable way to find the closest matching output signal sets for each time t directly given that without pruning there are $2^M$ possible reasonable combinations to search and the length of output signals Y[n] for a 1 minute signal is 60*44100*64 (i.e., 60 seconds, 44.1 kHz sampling frequency, and 64:1 oversampling ratio). Trellis searches, tree searches, and pruning have all been proposed as solutions to reducing the computation.

FIG. 3A depicts a model of a models filter 202 as a composite of two (2) transfer functions $H_1(z)$ and $H_2(z)$. The feedback of output candidate vector $Y_{Di}$ introduces quantization noise 302 into the feedback loop of look-ahead modulator 106 but not into the input of look-ahead modulator 106. Thus, loop filter 202 can be modeled as having two separate transfer functions, $H_1(z)$ and $H_2(z)$. The noise transfer function ("NTF") equals $1/[1+z^{-1}*H_2(z)]$. The signal transfer function ("STF") equals $H_1(z)/[1+z^{-1}*H_2(z)]$. In some implementations, H1 and H2 are identical. In the general case, H1 and H2 differ. The choice of implementation affects mainly the STF. For most purposes, the NTF is the critical design criterion, making the choice of H1 less critical.

FIG. 3B represents a typical fifth (5$^{th}$) order noise-shaping filter 300 with input x(n) and feedback y(n). Filter 300 represent one embodiment of filter 202 and can be applied to non-look-ahead and look-ahead delta-sigma modulators. The scale factors k and gain factors g are design choices. In one embodiment, the $k_1$ scale factor provides a unity gain for the first integrator stage 302. Equation 2 represents the transfer function $H_1(z)$:

$$H_1(z) = \frac{1}{(-1+z^{-1})(1+(-2+g1)z^{-1}+z^{-2})} \cdot (1+(-2+g2)z^{-1}+z^{-2})$$

Equation 2

Equation 2 represents the transfer function $H_2(z)$:

$$H_2(z) = \frac{k1 - (-1+z^{-1})(k2+k3 - k3z^{-1} + (k4+k5-k5z^{-1})(1+(-2+g1)z^{-1}+z^{-2}))}{(-1+z^{-1})(1+(-2+g1)z^{-1}+z^{-2}) \cdot (1+(-2+g2)z^{-1}+z^{-2})}$$

Equation 3

Equation 3.

FIGS. 3C and 3D depict the respective NTF and STF pole-zero plots of filter 300. The NTF is a high-pass function with multiple zeros in the signal band, and the STF is an all-pole low-pass function.

FIG. 4 depicts the transfer function of $H_2(z)$ when the NTF is set to be a seventh (7$^{th}$) order Butterworth filter with added NTF zeros. By minimizing sum of squares of the cost function elements $c_t$, the transfer function $H_2(z)$ 402 does not maintain a smooth transition as 0 dB is approached. Rather a spike 404 occurs, which represents noise. This noise will be in the near out-of-band frequency region, which is undesirable as it makes reproduction more difficult.

Accordingly, although conventional look-ahead delta-sigma modulators demonstrate improved linearity over standard (non-look-ahead) delta-sigma modulators, as discussed in Harpe, page 5, Harpe also observes on page 5 that in all cases the signal-to-noise ratio of Trellis architecture look-ahead delta-sigma modulators is several dB worse when compared to standard delta-sigma modulators.

SUMMARY OF THE INVENTION

In one embodiment of the present invention, a look-ahead delta-sigma modulator includes a digital filter to filter data derived from input signal data and respective elements of delayed output candidate vectors to generate filter output vectors, wherein the digital filter includes state variables that are updated via feedback of a selected output value. The look-ahead delta-sigma modulator further includes a quantization error generator, coupled to the digital filter to receive the filter output vectors, to determine a set of quantization error vectors from each set of M element modulator output candidate vectors and the filter output vectors, wherein M is greater than one and each element in the output candidate vectors is a potential output value of the delta-sigma modulator. The look-ahead delta-sigma modulator also includes an output generator to select from each set of quantization error vectors a quantization error vector associated with a modulator output candidate vector and to select an output from the associated modulator output candidate vector.

In another embodiment of the present invention, a method of determining output values of a delta-sigma modulator using quantization error vectors includes filtering data derived from input signal data and respective elements of M-element delayed output candidate vectors to generate filter output vectors. The method further includes generating quantization error vectors for each set of M element modulator output candidate vectors and each set of M element filter output vectors, wherein M is greater than one and each element in the output candidate vectors is a potential output value of the delta-sigma modulator. The method also includes selecting from each set of quantization error vectors a quantization error vector associated with one of the modulator output candidate vectors and generating an output from the associated modulator output candidate vector.

In a further embodiment of the present invention, a signal processing system includes an M-depth delta-sigma modulator delta-sigma modulator to determine output values from respective sets of M element modulator output candidate vectors using quantization error vectors, wherein M is greater than one, each element in the output candidate vectors is a potential output value of the delta-sigma modulator.

In another embodiment of the present invention, a method of determining an output signal using an M-depth delta-sigma modulator and quantization error vectors, wherein M is greater than one and each element in the output candidate vectors is a potential output value of the delta-sigma modulator includes processing an input signal vector and a set of delayed output candidate vectors. For each processed input signal vector and delayed output candidate vector, the method further includes computing a quantization error vector from the processed input signal vector and delayed output candidate vector and processing each quantization error vector to identify the output candidate vector that best matches the input signal vector. The method also includes selecting an output from the output candidate vector that best matches the input signal vector.

In another embodiment of the present invention, a method of processing a signal using a delta-sigma modulator includes determining output values of an M-depth delta-sigma modulator from respective sets of M element modulator output candidate vectors and an M element modulator input vector using quantization error vectors, wherein M is greater than one, each element in the output candidate vectors is a potential output value of the delta-sigma modulator.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 3C (prior art) represents a pole-zero plot of a noise transfer function of the filter of FIG. 3B.

FIG. 3D (prior art) represents a pole-zero plot of a signal transfer function of the filter of FIG. 3B.

DETAILED DESCRIPTION

There are at least two different interesting characteristics at issue with look-ahead delta-sigma modulators. The first is quantization error along with the desire to minimize the error and remove signal dependent quantization noise. As discussed in the Background section, most prior publications have shown an increase in in-band noise when using look-ahead modulators. The second issue involves loop stability. With greater loop stability, more aggressive noise shaping can be used to drive down the in-band noise. Look-ahead modulators can be designed using technology described herein to make better average choices in most circumstances, thereby reducing in-band noise without necessarily resorting to changing the loop filter.

It has been proposed in conventional publications that the power output of a delta-sigma noise-shaping filter is a good metric for optimization, i.e. see Equation 1. However, Equation 1 has at least two disadvantages: (1) Equation 1 is non-monotonic in magnitude frequency response and (2) Equation 1 is not appropriate for more than two quantization levels. Unfortunately, as discussed in the Background section, the approach of Equation 1 with look-ahead delta-sigma modulators can decrease the signal to noise ratio relative to conventional delta-sigma modulators.

Although conventional look-ahead delta-sigma modulators increase in-band noise for greater stability, the look-ahead delta-sigma modulator described herein can maintain superior stability while achieving the unexpected result of lower in-band noise relative to conventional look-ahead delta-sigma modulators and conventional non-look-ahead delta-sigma modulators. The signal processing systems described herein include a look-ahead delta-sigma modulator that processes multiple output candidate vectors and an input vector to determine a quantization error vector for each output candidate vector. In one embodiment, the quantization error vector represents a difference between a cost value vector and an input candidate vector. Look-ahead delta-sigma modulator output values are selected using the quantization error vectors by, for example, determining the minimum power quantization error vector for each input vector X and selecting the output value from the input candidate vector associated with the minimum power quantization error vector. Quantization error vectors can also be weighted using a non-uniform weighting vector.

Figure 6:
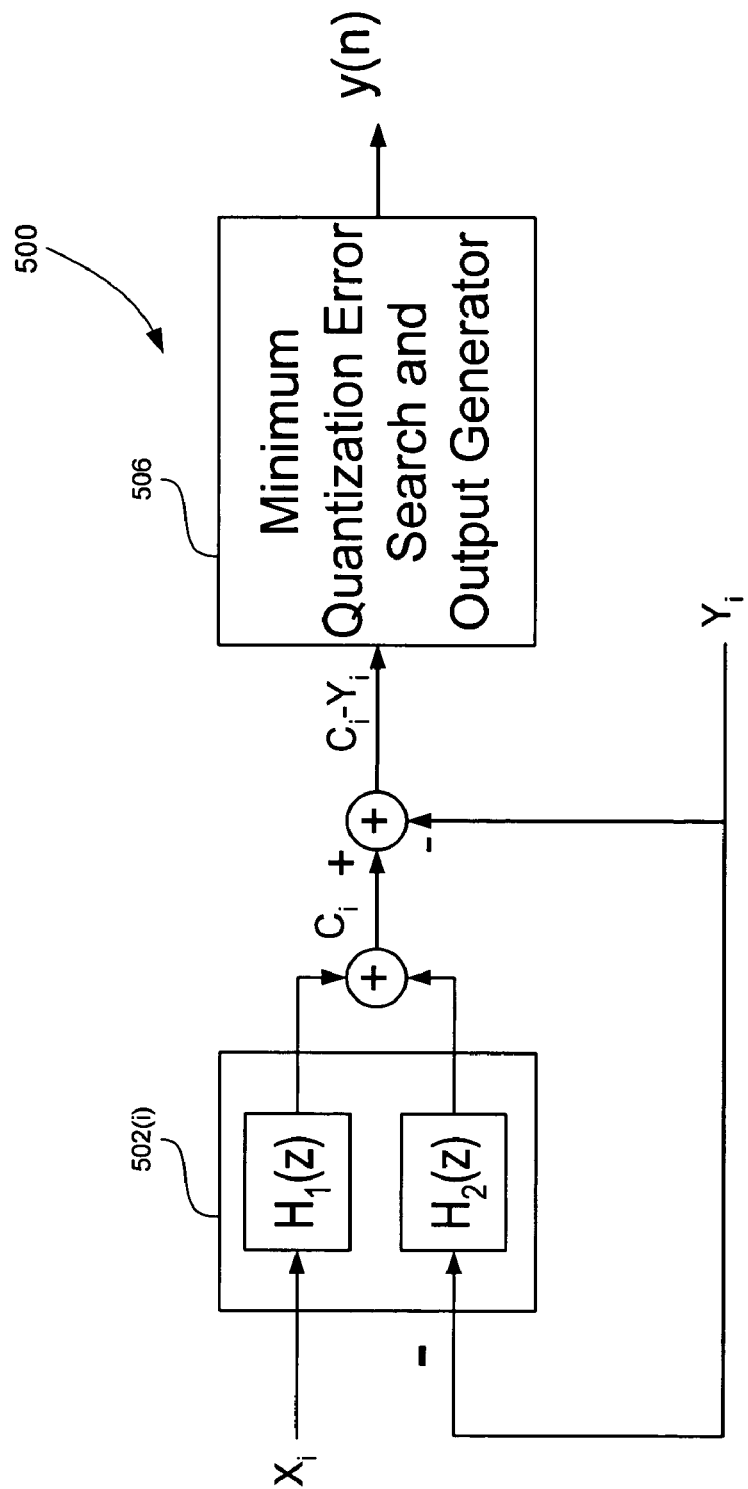
FIG. 6 depicts a model of the look-ahead modulator of FIG. 5.

The look-ahead delta-sigma modulators of the signal processing systems described herein include a loop filter with a noise transfer function ("NTF") and a signal transfer function ("STF"). When the loop filter is designed, the filter is designed around optimizing the NTF quantity $1/[1+z^{-1}*H_2(z)]$ ("$H_2(z)$ is illustrated in FIG. 6). Optimizing "$1/[1+z^{-1}*H_2(z)]$" is effectively the same as minimizing $z+H_2(z)$. Minimizing $z+H_2(z)$ effectively minimizes a difference between the input and output values of the look-ahead delta-sigma modulator quantizer. The difference between the input and output values of the quantizer represents quantization error. Thus, the look-ahead delta-sigma modulators of the signal processing system described herein selects an output based on quantization error values. In one embodiment, quantization error represents a difference between each filter output vector $C_i$ and each output candidate vector $Y_i$, $i=\{0, 1, 2, \ldots N-1\}$. The look-ahead delta-sigma modulator output value is selected from $Y_i$, where $[C_i-Y_i]^{(2)}_{min}$ represents the minimum quantization error power.

Figure 5:
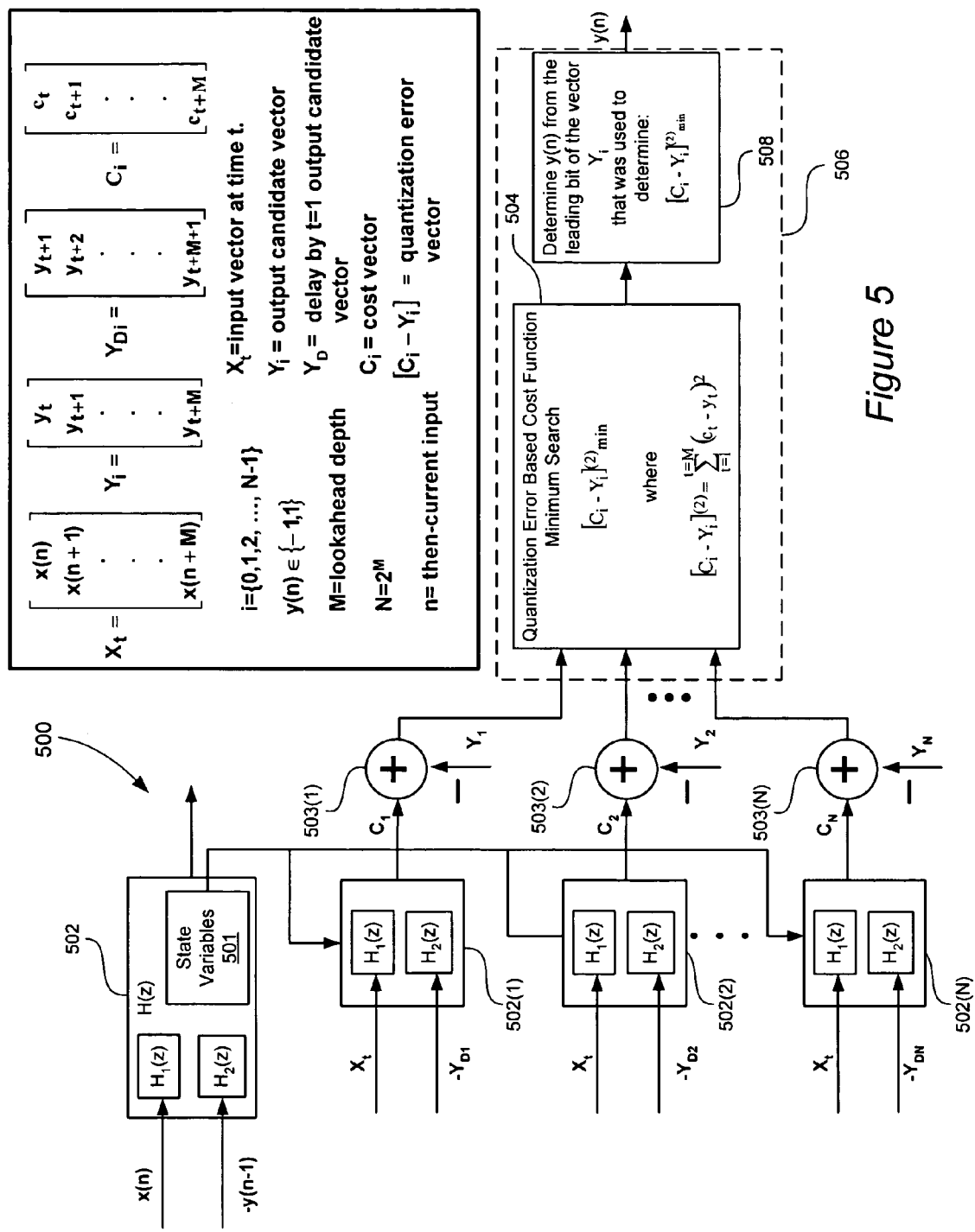
FIG. 5 depicts a signal processing system having a look-ahead delta-sigma modulator with quantizer input values representing quantization error.

FIG. 5 depicts one embodiment of a digital signal processing system that includes a look-ahead delta-sigma modulator for selecting output values using quantization error. In one embodiment, the look-ahead delta-sigma modulator 500 processes a discrete-time, oversampled input signal pattern, X[n], and determines the best output signal pattern Y[n] to approximate X[n] in a signal bandwidth, $X[n]=x_1, x_2, x_3, \ldots$ and $Y[n]=y_1, y_2, y_3, \ldots$. "Best" can be defined as closest matching in the signal band of interest. "Closest matching" can be defined, for example, in a power sense (lowest distance), in a minimum/maximum sense, in a psycho-acoustically weighted sense, other desired measure. Thus, in one embodiment, the "best" output signal pattern Y[n] is the pattern Y[n] such that $[H(X-Y_D)-Y]$ has the lowest power. A "signal band of interest" is, for example, a frequency band containing a signal with data of interest. For example, an audio signal band of interest is approximately 0 Hz to 25 kHz. It will be apparent to those of ordinary skill in the art that the signal processing system described herein can be adapted to determine the best, closest matching output signal pattern under varying constraints and are not limited to the constraints of "best" and "closest matching" set forth herein, but rather constraints can be defined to accomplish desired goals.

Referring to FIG. 5, look-ahead delta-sigma modulator 500 represents an embodiment of a look-ahead delta-sigma modulator that uses quantization error to determine output values. The look-ahead delta-sigma modulator 500 determines each filter output vector $C_i$ for time t in the same manner as look-ahead modulator 106 by applying a filter function to input vector $X_t$ and each negative delayed output candidate vector $-Y_{Di}$, $i=\{1, 2, \ldots, N\}$, M=the look-ahead depth and $N=2^M$. The delay of delayed output candidate vector $Y_{Di}$ is t+x, where x=1 or other real number determined in accordance with design choices. The number of calculations performed by look-ahead delta-sigma modulator 500 can be reduced using pruning or other computation reduction methods. Pruning techniques include eliminating or reducing processing of redundant cost value vectors and eliminating or reducing redundant arithmetic calculations.

Look-ahead delta-sigma modulator 500 performs noise shaping on the input data, input vector $X_t$ and each negative delayed output candidate vector $-Y_{Di}$, in accordance with respective loop filter 502(i) transfer function. In one embodiment, the state variables used by each loop filter 502(i) are identical as depicted by loop filter 502 and connecting lines indicating the common use of the state variables 501. In one embodiment, loop filter 502(i) is identical to loop filter 202(i), $i=\{1, 2, \ldots, N\}$.

Multiple quantization error vectors ($C_i-Y_i$) are determined by changing the values of each output candidate vector. For example, for an M-depth output candidate vector $Y_i$, if each element of $Y_i$ has two possible values, then there are up to $2^2$ possible output candidate vectors, $Y_1$, $Y_2$, $Y_3$, and $Y_4$. The number of output candidate vectors can be pruned by, for example, eliminating or reducing redundant arithmetic operations. Selection of output values for the look-ahead delta-sigma modulator can be based upon any of a number of techniques.

Referring to FIGS. 5 and 6, loop filter 202 can be modeled as having two separate transfer functions, $H_1(z)$ and $H_2(z)$. The noise transfer function ("NTF") equals $1/[1+z^{-1}*H_2(z)]$. The signal transfer function ("STF") equals $H_1(z)/[1+z^{-1}*H_2(z)]$. When the loop filter 502(i) is designed, the filter 502(i) is designed around optimizing the NTF quantity $1/[1+z^{-1}*H_2(z)]$. Optimizing "$1/[1+z^{-1}*H_2(z)]$" is effectively the same as minimizing $z+H_2(z)$. Minimizing $z+H_2(z)$ effectively minimizes a difference between the input and output values of the look-ahead delta-sigma modulator quantizer. The difference between the input $C_i-Y_i$ is one embodiment of quantization error. Thus, look-ahead delta-sigma modulator 500 selects an output value y(n) using quantization error values.

Conventional look-ahead delta-sigma modulators use the minimum cost value power value, $C_i^{(2)}_{min}$ as determined by Equation 1. This determination effectively drives the inputs to quantizer 203 to small values and, thus, effectively increases the loop gain of look-ahead delta-sigma modulator 106 and adversely modified the NTF.

In one embodiment of look-ahead delta-sigma modulator 500, the look-ahead delta-sigma modulator 500 includes a minimum quantization error noise search module 504 that selects the minimum power quantization error for each quantization error vector, $C_i-Y_i$, $i=\{1, 2, \ldots, N\}$. Search module 504 computes quantization error power $(C_i-Y_i)^{(2)}$ by determining a sum of squares in accordance with Equation 4:

$$(C_i - Y_i)^{(2)} = \sum_{t=1}^{t=M} (c_t - y_t)^2 \qquad \text{Equation 4}$$

"$c_t$" represents a filter 202 output for time t, t=1 through M, in the cost vector $C_i$ and $y_t$ represents an output candidate for time t in the cost vector $Y_i$. The y(n) selector module 508 selects y(n) as the leading bit of $Y_i$ from $[C_i-Y_i]^{(2)}_{min}$. $[C_i-Y_i]^{(2)}_{min}$ represents the minimum quantization error power.

For example, if M=2 and $y \in \{-1,+1\}$, then N=4, $i \in \{0,1,2,3\}$, and Table 3 represents each of the Y output candidate vectors and the input candidate vector $X_t$.

TABLE 3

|     | $Y_1$ | $Y_2$ | $Y_3$ | $Y_4$ | $X_t$ |
| --- | --- | --- | --- | --- | --- |
| $y_t$ | 0 | 0 | 1 | 1 | x(n) |
| $y_{t+1}$ | 0 | 1 | 0 | 1 | x(n + 1) |

If $(C_3-Y_3)^{(2)}$ represents the minimum quantization error power value, then selector module 508 selects y(n)=1 because the first bit in output candidate vector $Y_3$ (the output candidate vector associated with $(C_3-Y_3)^{(2)}$, equals 1. If $(C^2-Y_2)^{(2)}$ represents the minimum quantization error power value, then selector module 508 selects y(n)=0 because the first bit in output candidate vector $Y_2$ (the output candidate vector associated with $(C_2-Y_2)^{(2)}$), equals 0. This example can be extrapolated to cover any look-ahead depth and number of output candidate sets. To maintain causality, only earlier quantization values are fed back to the filter. If the look-ahead depth is 4 and the current time is 10, for example, the feedback vector choices are the 16 possible sets of values for times 10, 11, 12 and 13. The filter output at time 12 will be a function of all output choices up to time 11, but not of the output choice for time 12. Similarly, the filter output at time 13 will depend on choices up to time 12. The quantization error will depend on the current filter output and the current output candidate. The quantization error at time 13 therefore depends on the value of choices at times 10 through 13. The four quantization errors used are those at times 10 through 13. This differs from the behavior when using C to create the cost function. In that case, the four filter outputs used for the optimization will be 11 through 14, as 10 is unaffected by the choice of the current vector.

Thus, if look-ahead modulator 500 looks ahead 10 decisions (i.e., depth M=10) using one decision bit (i.e., y∈{-1,+1}) and advancing periodically in time, at each time point 1024 distances are calculated (assuming no pruning). If search module 504 is locating the best output value y at time t, then all possible {$y_0, y_1, \ldots y_9$} will be tried. On the next step, search module 504 will search for the best output value y at time t+1. In another embodiment, look-ahead modulator 500 can generate an output having multiple output values. For example, in one embodiment the selector module 508 can produce r output values for each input by providing as an output the r leading bits of the output candidate vector having the minimum quantization error power value, where generally 1≦r≦M (the depth of the output candidate vector) and, in one embodiment r equals 2. The r outputs are then fed back to the noise shaping filter 502 and the state variables are updated r times.

When minimizing the quantization error, minimum quantization error search and output generator 506 has a defined gain. Additionally, the demonstrated signal-to-noise ratio of look-ahead delta-sigma modulator 500 exhibits in some cases a 10 dB improvement over conventional look-ahead delta-sigma modulators.

Figure 7:
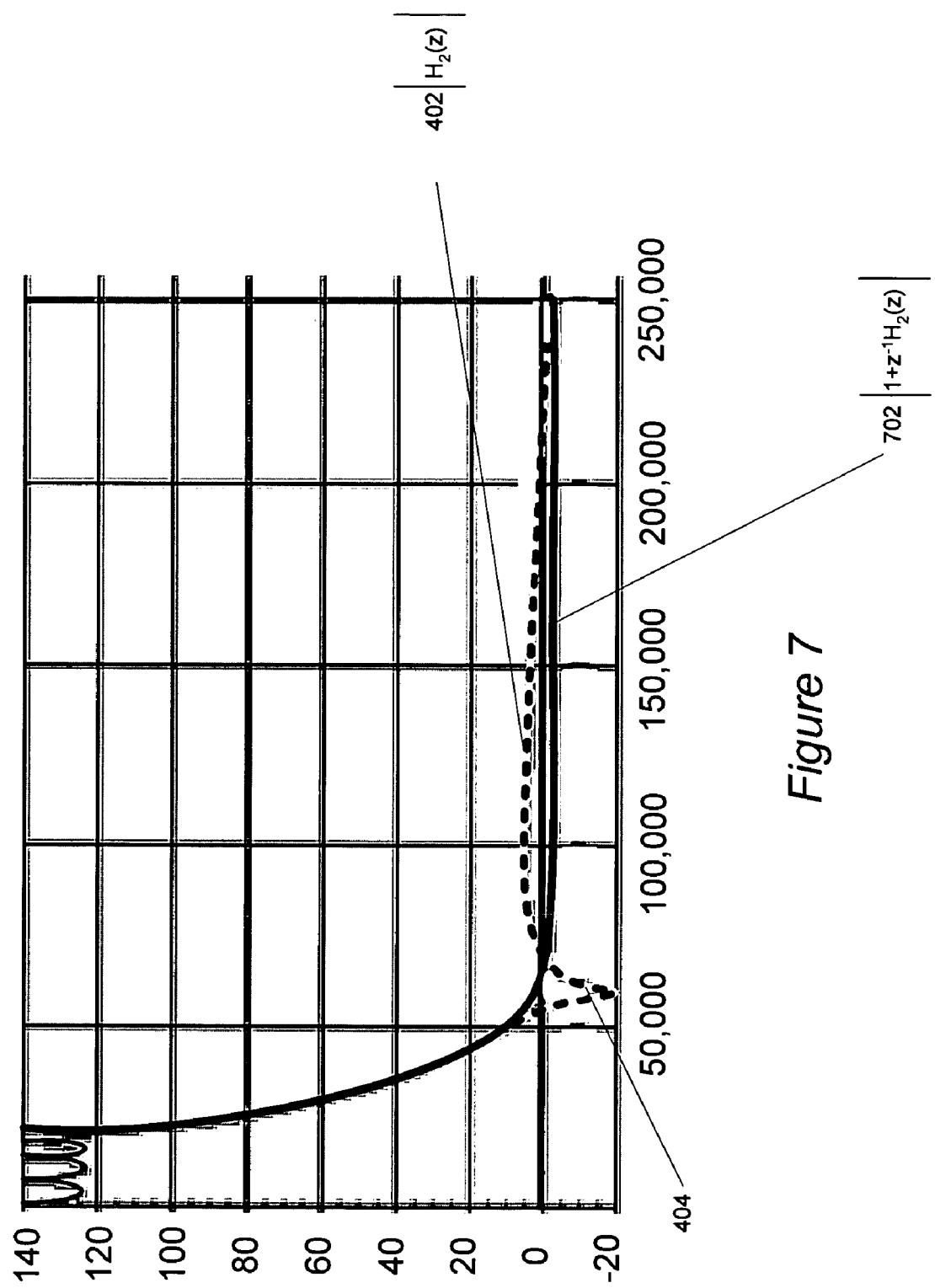
FIG. 7 depicts an example loop filter transfer function of the look-ahead modulator of FIG. 5.

FIG. 7 depicts a comparison of the transfer function of $H_2(z)$ for look-ahead delta-sigma modulator 106 with $1+z^{-1}H_2(z)$ of delta-sigma modulator 500 when the NTF is set to be a seventh (7$^{th}$) order Butterworth filter with added NTF zeros. The plot 702 obtained using look-ahead delta-sigma modulator 500 demonstrates a smooth transition where the spike 404 occurs. Thus, plot 702 demonstrates quantization noise shaping improvement by reducing noise in a signal bandwidth of interest (e.g. 0 Hz–25 kHz) by look-ahead delta-sigma modulator 500 relative to conventional look-ahead delta-sigma modulators.

Figure 8:
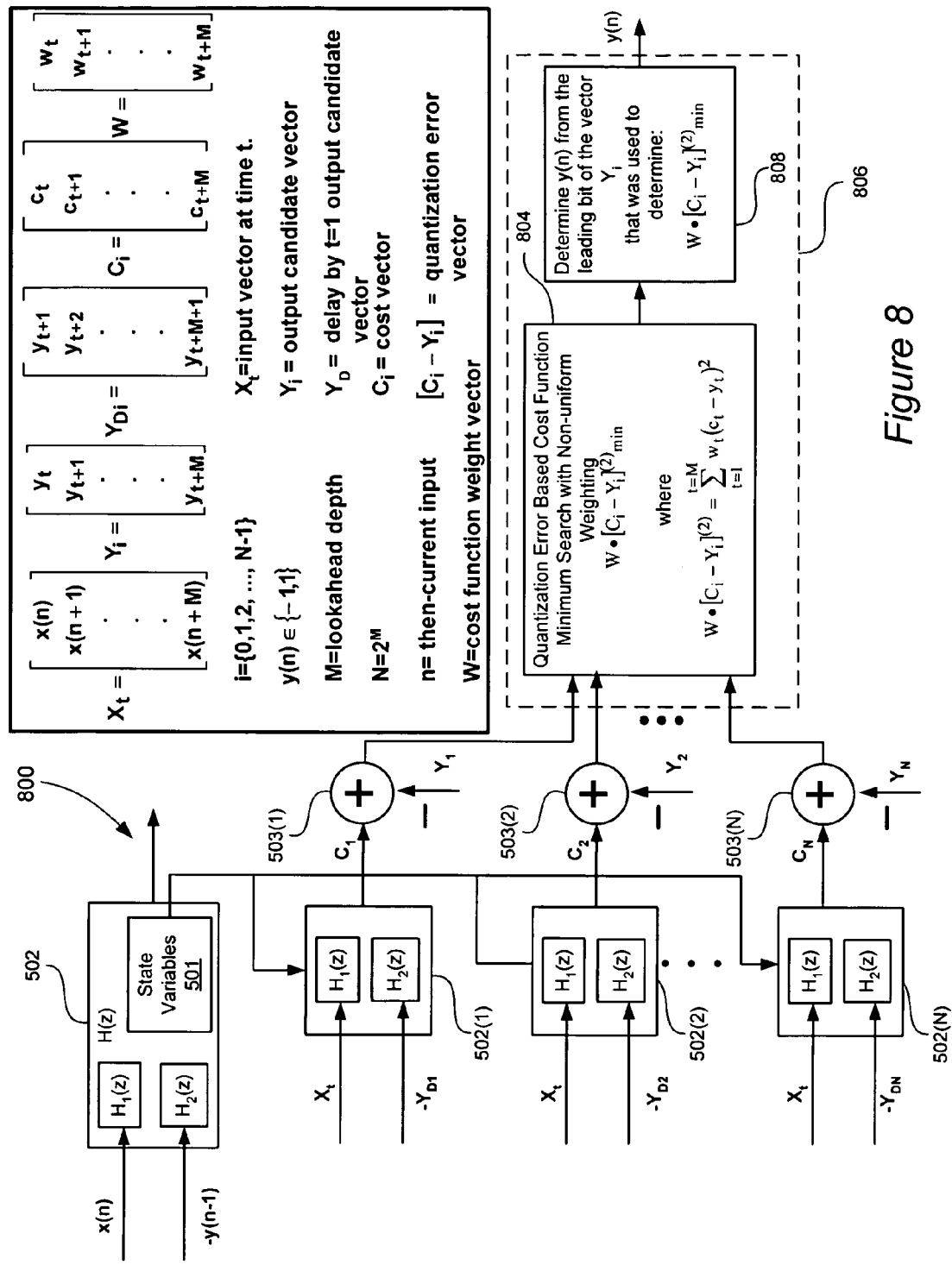
FIG. 8 depicts a signal processing system having a look-ahead delta-sigma modulator with weighted quantization error vectors.
Figures 9A, 9B, 9C, 9D, 9E, 9F:
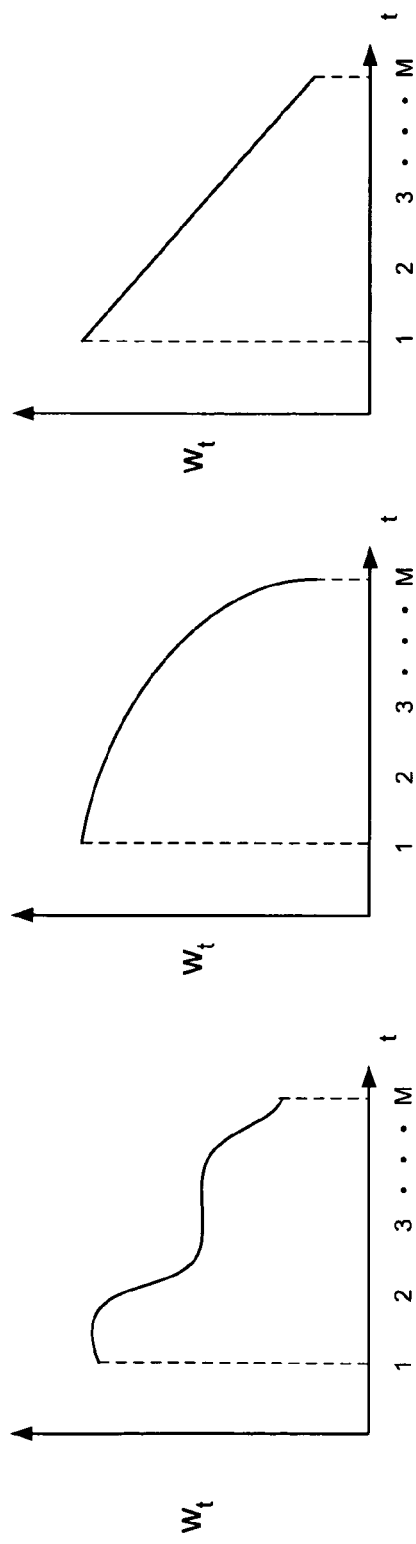
FIGS. 9A–9F depict weighting windows with a downward weighting trend.

Referring to FIG. 8, look-ahead delta-sigma modulator 800 represents an embodiment of a look-ahead delta-sigma modulator using time weighted, frequency weighted error values and quantization error to determine output values. The look-ahead delta-sigma modulator 800 is identical to look-ahead delta-sigma modulator 500 except for minimum quantization error search and output generator 806. The non-uniform weighted minimum quantization error noise search module 804 minimizes the scalar, power of a weighted quantization error vector $C_i-Y_i$, for i∈{0,1, 2, . . . , N–1}. Search module 304 computes $W \cdot [C_i-Y_i]^{(2)}$ in accordance with Equation 5:

$$W \cdot [C_i - Y_i]^{(2)} = \sum_{t=1}^{t=M} w_t(c_t - y_t)^2 \qquad \text{Equation 5}$$

"$c_t-y_t$" represent a quantization error value for time t, t=1 through M, in the quantization error vector $C_i-Y_i$, $w_t$ represents a weight for time t in the weight cost function vector W. Vector W represents one embodiment of a non-uniform weight vector. "$W \cdot [C_i-Y_i]^{(2)}_{min}$" represents the minimum weighted, quantizer input/output difference power. The y(n) selector module 808 selects y(n) as the leading bit of output candidate vector $Y_i$ from $W \cdot [C_i-Y_i]^{(2)}_{min}$. The non-uniform weight vector W includes, for example, at least one non-zero weight element that is different from another weight element value or at least one non-unity, non-zero weight value. Weighting the quantization error vector can be accomplished by determining the dot product of the quantization error vector and the time-domain weight vector.

In general, the look-ahead delta-sigma modulator 800 represents one embodiment of look-ahead delta-sigma modulators that weight quantization error vector elements with at least one non-zero, non-unity weight (i.e., not equal to 1). Non-uniform weighting can allow a delta-sigma modulator to obtain higher signal-to-noise ratios than conventional look-ahead delta-sigma modulators while maintaining linearity associated with the conventional look-ahead delta-sigma modulators.

The elements of the non-uniform weight vector W are a matter of design choice and are generally chosen empirically to minimize output signal noise. In one embodiment, the elements of the weight vector trend downward in the time-domain. However, weighting using selected nonuniform weights, such as a downward trending weight vector, decreases the aliasing due to truncation of the sample set, and improves the signal-to-noise ratio of the look-ahead delta-sigma modulator 300.

Figure 1:
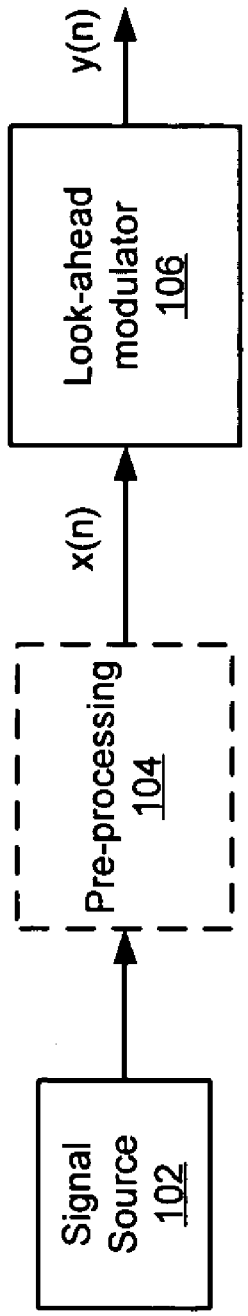
FIG. 1 (prior art) depicts a signal processing system with a conventional look-ahead delta-sigma modulator.
Figure 2:
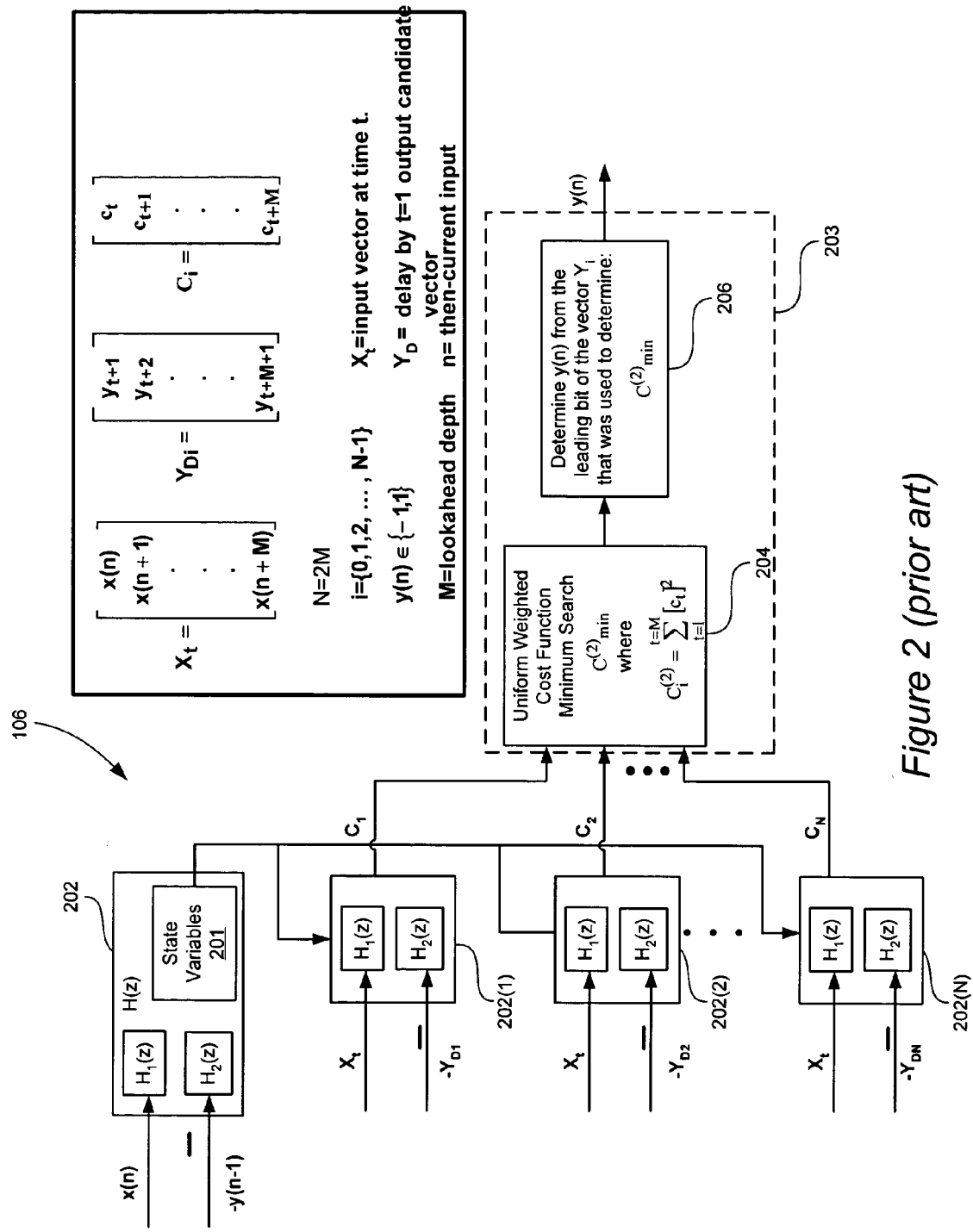
FIG. 2 (prior art) depicts example data used by the look-ahead delta-sigma modulator of FIG. 1 to determine an output signal.
Figure 3A:
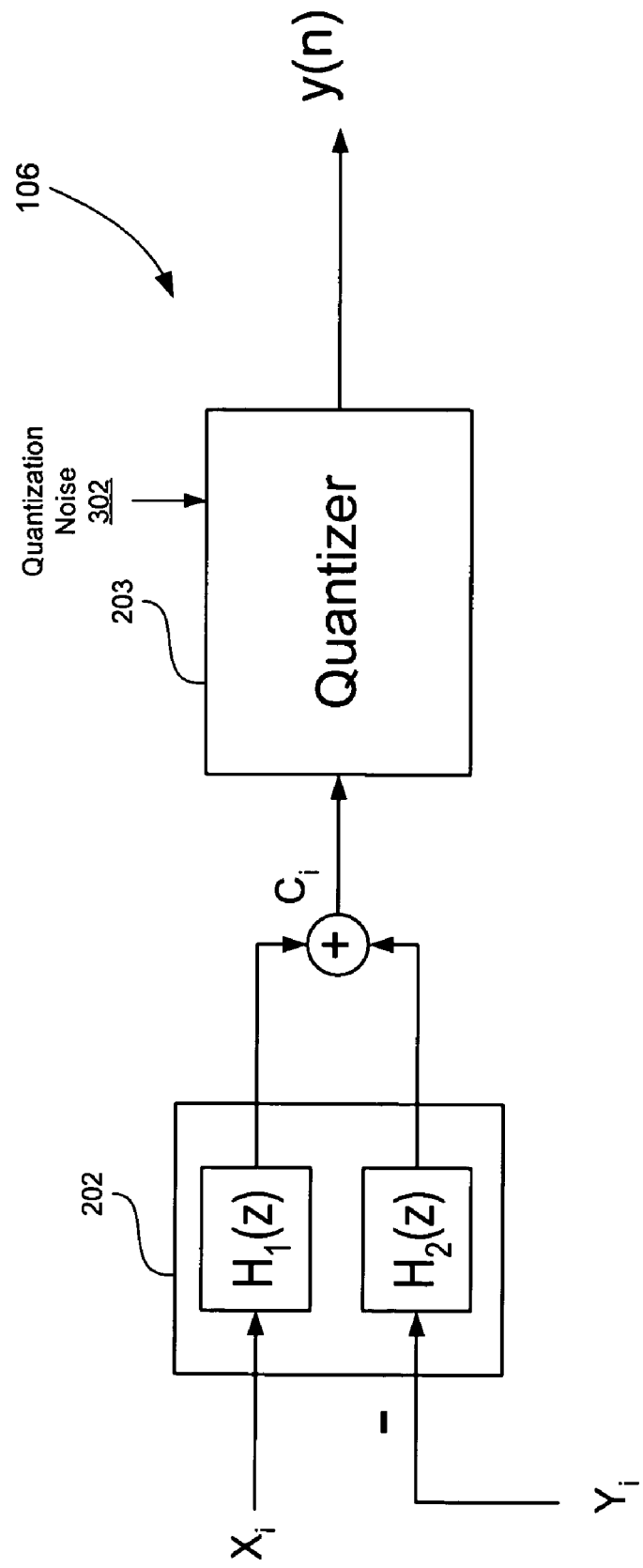
FIG. 3A (prior art) depicts a model of the look-ahead modulator of FIG. 1 that includes a model of a noise shaping filter.
Figure 3B:
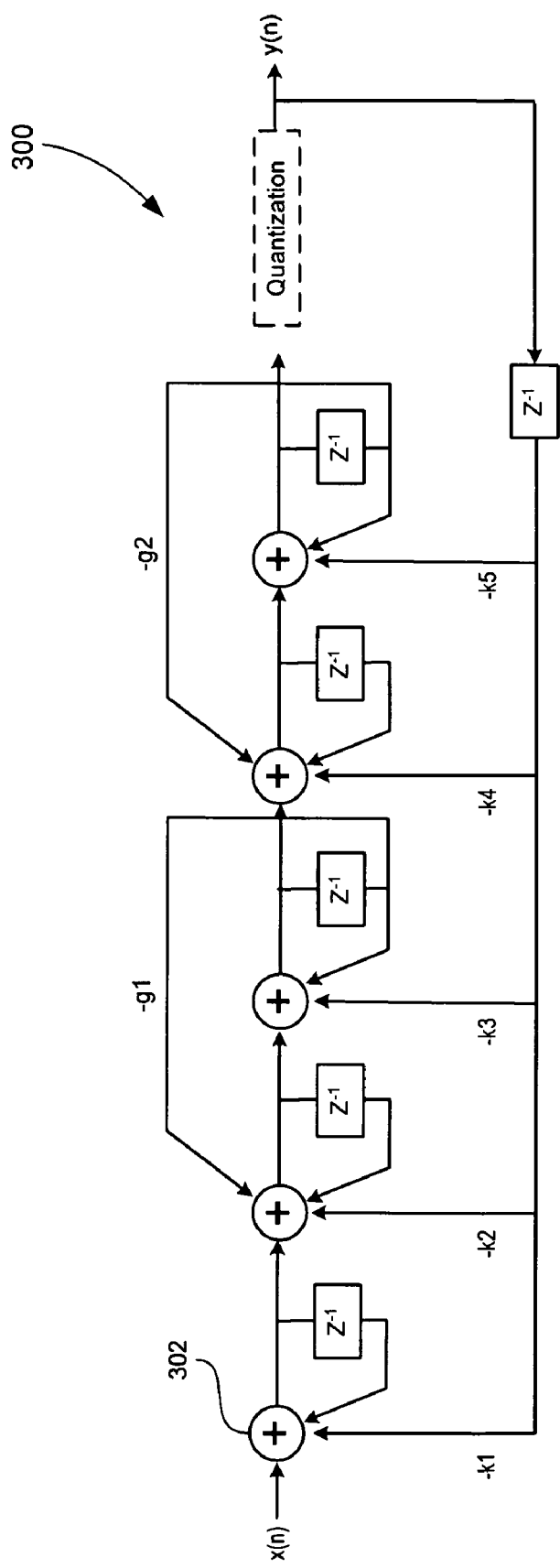
FIG. 3B (prior art) represents a noise shaping filter of FIG. 3A.
Figure 4:
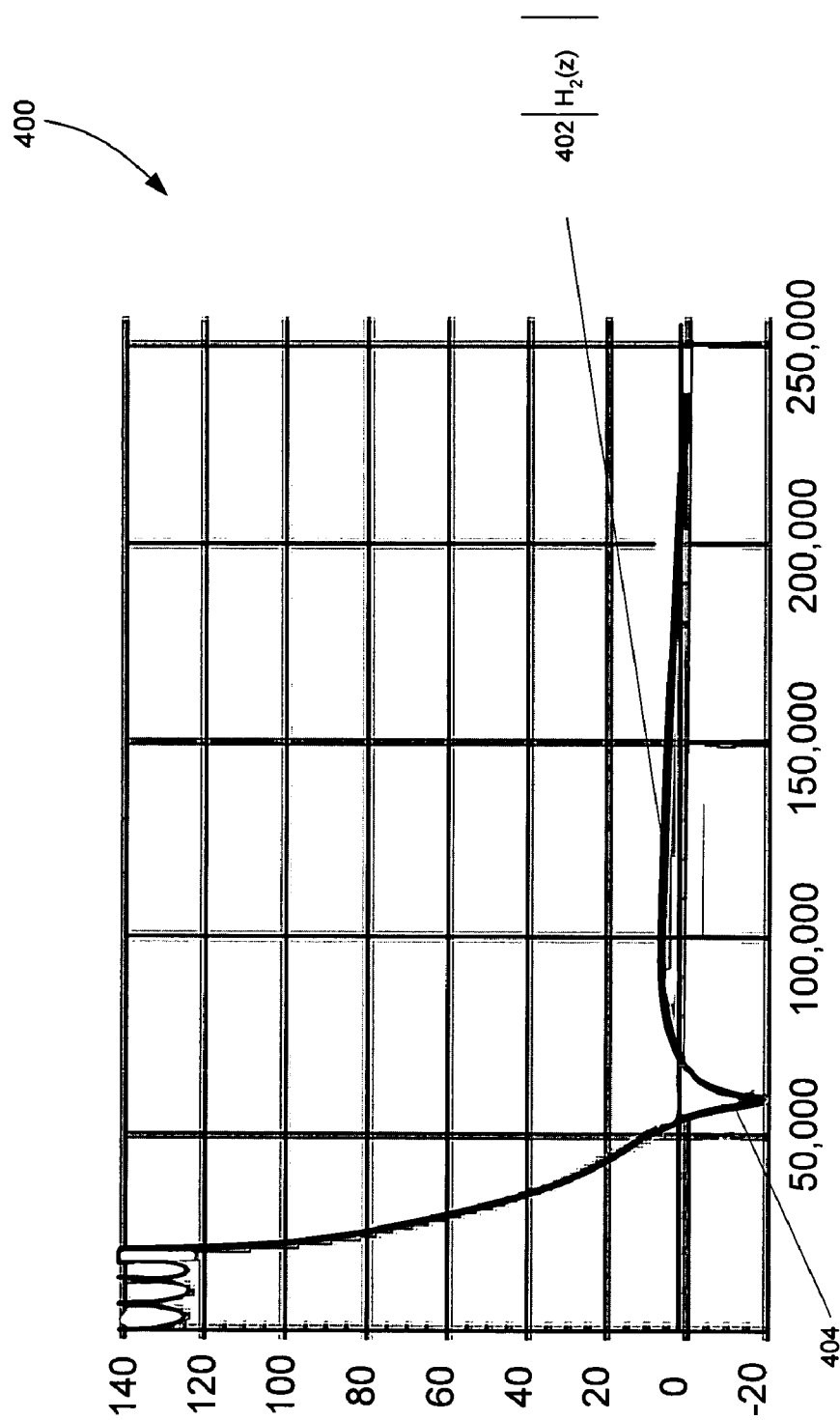
FIG. 4 (prior art) depicts an example loop filter transfer function of the look-ahead modulator of FIG. 1.

FIGS. 9A–9F (collectively "FIG. 9") depict various exemplary weight vectors applied by the non-uniform weighted minimum quantization error noise search module 804. FIG. 4 depicts the weight vectors as windows that weight each set of cost value powers and depicts exemplary weighting windows with a downward weighting trend. In FIG. 4A, the depth equals 4 and the elements of the weight vector equal $w_t=1.5^{M-1-t}$. Thus, the window is exponential in nature. If $w_t=1.5$, the earliest cost value output would be weighted 3.375 times as much as the last cost value output. As FIG. 9 illustrates, any variety of windows can be used with look-ahead delta-sigma modulator 800. Exponential windows are generally the easiest to implement with Trellis delta-sigma modulators.

A tapered weight vector applied before summing the power in the search module 804 solves the quality problem associated with unity weighting and improves both signal-to-noise ratio and the noise transfer shaping. Weighting windows similar to FIG. 4C, having weight vector W=[1.0, 1.0, 1.0, 1.0, 1.0, 0.92, 0.80, 0.70, 0.52, 0.24], perform well for a depth of 10. The window depicted in FIG. 9C can be difficult to implement in a look-ahead system that re-uses prior cost computations, as Trellis and tree structures often do. An exponentially decaying window such as the window of FIG. 9A can be exploited in these cases. The results obtained using advantages of the rectangular window have empirically fallen short of empirical results obtained using the convex type of taper shown in FIG. 9A. Weight elements, $w_i$, in a weight vector W can also be defined to be within particular ranges. For example, a weight vector can be defined as W=[$w_0$, $w_1$, $w_2$, $w_3$, ... ], where w0, w1, and w2 have values within approximately +/−5% of each other and w3 is approximately 80% or less of $w_0$, $w_1$, or $w_2$. The best window for a particular depth and application can be determined empirically. The Melanson Weighting Patent describes further embodiments and applications of weight vectors W.

Figure 10:
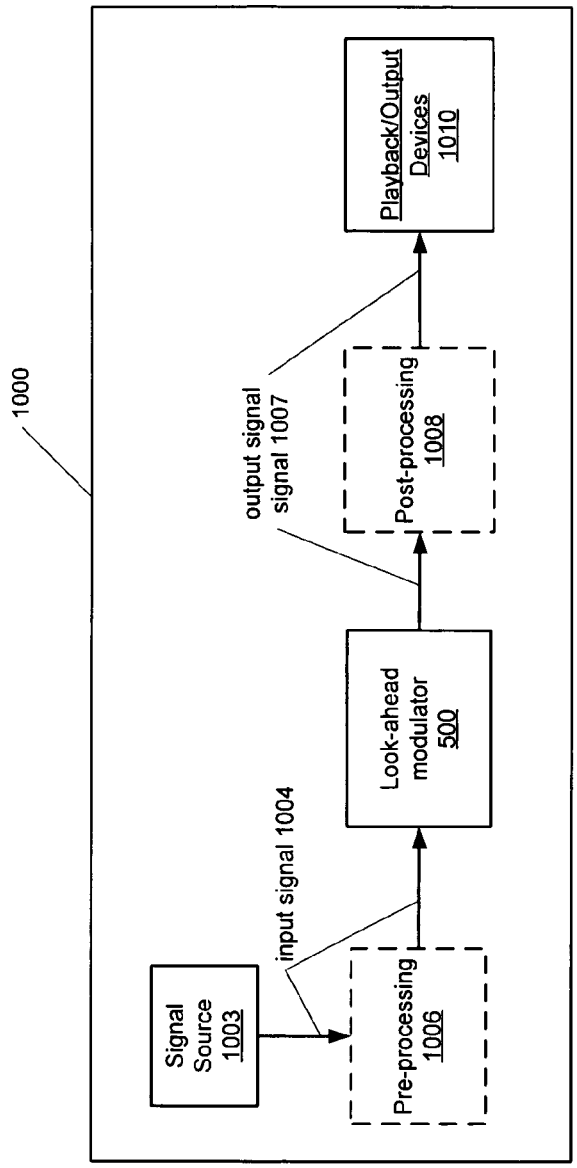
FIG. 10 depicts a signal processing system that includes a look-ahead modulator of FIG. 5, an output device and process, and an output medium.

Referring to FIG. 10, signal processing system 1000 depicts one embodiment of a signal processing system that includes look-ahead modulator 500. Signal processing system 1000 is particularly useful for high-end audio applications such as super audio compact disk ("SACD") recording applications. Signal processing system 1000 processes an input signal 1004 generated by an input signal source 1003. The input signal 1004 may be digital or analog and may be from any signal source including signals generated as part of a recording/mixing process or other high end audio sources or from lower-end sources such as a compact disk player, MP3 player, audio/video system, audio tape player, or other signal recording and/or playback device.

The input signal 1004 may be an audio signal, a video signal, an audio plus video signal, and/or other signal type. Generally, input signal 1004 undergoes some preprocessing 1006 prior to being modulated by look-ahead modulator 1002. For example, pre-processing 1006 can involve an interpolation filter to oversample a digital input signal 1004 in a well-known manner. Pre-processing 1006 can include an analog-to-digital converter to convert an analog input signal 1004 into a digital signal. Pre-processing 1006 can also include mixing, reverberation, equalization, editing, out-of-band noise filtering and other filtering operations.

In the digital domain, pre-processing 1006 provides discrete input signals X[n] to look-ahead modulator 1102. Each discrete input signal x[n] is a K-bit signal, where K is greater than one. As previously described in more detail, look-ahead modulator 500 processes input signals X[n] and candidates Y[n] to determine an output signal 1007. Output signal 1007 is, for example, a collection of one-bit output values. The output signal 1007, thus, becomes an encoded version of the input signal 1004.

Figure 11:
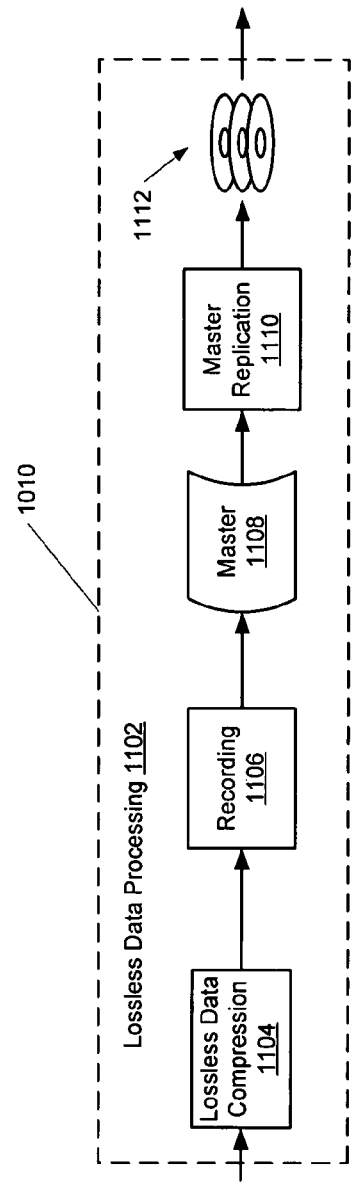
FIG. 11 depicts post-processing operations in an embodiment of the signal processing system of FIG. 8.

Referring to FIGS. 10 and 11, signal processing system 1000 typically includes post-processing 1008 to post-process the output signal 1007 of look-ahead modulator 500. Post-processing 1008 can include lossless data processing 1102. For SACD audio mastering, there is a lossless data compression stage 1104, followed by a recording process 1106 that produces the actual pits that are burned into a master storage medium 1108. The master storage medium 1108 is then mechanically replicated to make the disks (or other storage media) 1112 available for widespread distribution. Disks 1112 are, for example, any variety of digital versatile disk, a compact disk, tape, or super audio compact disk. Playback/output devices 1010 read the data from the disks 1112 and provide a signal output in a format perceptible to users. Playback/output devices 1010 can be any output devices capable of utilizing the output signal 1007. Thus, the storage media 1108 and 1112 include data encoded using signal modulation processes achieved using look-ahead modulator 500.

Many systems can implement look-ahead delta-sigma modulator 500. For example, the weighting of look-ahead delta-sigma modulator 500 can be implemented using hardware and/or software.

Although the present invention has been described in detail, it should be understood that various changes, substitutions and alterations can be made hereto without departing from the spirit and scope of the invention as defined by the appended claims.

What is claimed is:

1. A look-ahead delta-sigma modulator comprising:
a digital filter to filter data derived from input signal data and respective elements of delayed output candidate vectors to generate filter output vectors, wherein the digital filter includes state variables that are updated via feedback of a selected output value;
a quantization error generator, coupled to the digital filter to receive the filter output vectors, to determine a set of quantization error vectors from each set of M element modulator output candidate vectors and the filter output vectors, wherein M is greater than one and each element in the output candidate vectors is a potential output value of the delta-sigma modulator; and
an output value generator to select from each set of quantization error vectors a quantization error vector associated with a modulator output candidate vector and to select an output value from the associated modulator output candidate vector.

2. The delta-sigma modulator of claim 1 wherein the quantization error generator determines one quantization error vector for each output candidate vector.

3. The delta-sigma modulator of claim 1 further comprising a recording system to store output values generated by the output value generator.

4. The delta-sigma modulator of claim 1 further comprising a storage medium having the output values encoded thereon.

5. The delta-sigma modulator of claim 1 further comprising a storage medium having data derived from output values encoded thereon.

6. The delta-sigma modulator of claim 1 wherein the set of quantization error vectors determined by the error generator equals $2^M$. candidate vector.

7. The delta-sigma modulator of claim 1 wherein the set of quantization error vectors determined by the quantization error generator is a non-redundant set and contains less than $2^M$ quantization error vectors.

8. The delta-sigma modulator of claim 1 wherein each element of each modulator output candidate vector has two possible values.

9. The delta-sigma modulator of claim 1 wherein the delta-sigma modulator is a Trellis type delta-sigma modulator.

10. The delta-sigma modulator of claim 1 wherein the delta-sigma modulator is a tree-based delta-sigma modulator.

11. The delta-sigma modulator of claim 1 wherein a set of Y output values most closely represent a corresponding set of Y input values in a signal band of interest, wherein Y is a positive integer.

12. The delta-sigma modulator of claim 11 wherein each output value represents a leading bit of each modulator output candidate associated with each identified quantization error vector.

13. The delta-sigma modulator of claim 11 wherein the quantization error vector associated with the modulator output candidate vector from which the output value is selected is the quantization error vector having a minimum power in comparison to the remaining quantization error vectors in the set.

14. The delta-sigma modulator of claim 1 wherein the delta-sigma modulator is implemented using software.

15. The delta-sigma modulator of claim 1 further comprising:
a quantizer, wherein an $i^{th}$ quantization error vector in the set of quantization error vectors comprises a difference between an $i^{th}$ digital filter output vector $C_i$ and an $i^{th}$ modulator output candidate vector $Y_i$, wherein the vector $C_i$ represents an $i^{th}$ M-element vector derived from a difference between the look-ahead delta-sigma modulator input vector and an $i^{th}$ M-element delayed output candidate vector $Y_{Di}$.

16. The delta-sigma modulator of claim 15 wherein the $i^{th}$ quantization error vector comprises filter output vector $C_i$-output candidate vector $Y_i$.

17. The delta-sigma modulator of claim 1 wherein each cost value vector comprises a difference between an $i^{th}$ quantizer input vector and the $i^{th}$ modulator output candidate vector.

18. The delta-sigma modulator of claim 1 further comprising:
a weighting module to non-uniformly weight each quantization error vector with a weight vector.

19. The delta-sigma modulator of 18 wherein the weight vector includes at least one non-zero weight element that is different from another non-zero weight element.

20. The delta sigma modulator of claim 19 wherein magnitudes of each non-zero weight element of the weight vector trend downward as a look-ahead depth of the error values increase.

21. The delta sigma modulator of claim 20 wherein the magnitudes of each non-zero weight element of the weight vector decrease linearly.

22. The delta-sigma modulator of claim 20 wherein the magnitudes of each non-zero weight element of the weight vector decrease exponentially.

23. The delta sigma modulator of claim 20 wherein the weight vector that includes elements $[w_0, w_1, w_2, w_3, \ldots]$, wherein $w_0$, $w_1$, and $w_2$ have magnitudes within approximately +/−5% of each other and $w_3$ has a magnitude of approximately 80% or less of the magnitude of one of the previous elements.

24. The delta-sigma modulator of claim 1 wherein the output selected by the output generator comprises r output values, wherein r is any integer between 1 and M.

25. A method of determining output values of a delta-sigma modulator using quantization error vectors, the method comprising:
(a) filtering data derived from input signal data and respective elements of M-element delayed output candidate vectors to generate filter output vectors;
(b) generating quantization error vectors for each set of M element modulator output candidate vectors and each set of M element filter output vectors, wherein M is greater than one and each element in the output candidate vectors is a potential output value of the delta-sigma modulator;
(c) selecting from each set of quantization error vectors a quantization error vector associated with one of the modulator output candidate vectors; and
(d) generating an output from the associated modulator output candidate vector.

26. The method of claim 25 further comprising:
determining a difference between the filter output vectors and output candidate vectors to generate the quantization error vectors;
feeding back each output value to a filter that filters the data derived from input signal data and respective elements of the output candidate vectors; and
updating state variables of the filter with the output values fed back to the filter.

27. The method of claim 25 further comprising generating one quantization error vector for each output candidate vector.

28. The method of claim 25 further comprising repeating (a), (b), and (c) for each of a plurality of input values to the delta-sigma modulator.

29. The method of claim 28 wherein a set of Y output values most closely represent a corresponding set of Y input values in a signal band of interest, wherein Y is a positive integer.

30. The method of claim 25 further comprising:
recording data derived from the output values on storage medium.

31. The method of claim 25 further comprising:
recording the output values on a storage medium.

32. The method of claim 25 wherein generating quantization error vectors comprises generating $2^M$ quantization error vectors.

33. The method of claim 25 wherein generating quantization error vectors comprises generating a nonredundant set that contains less than $2^M$ quantization error vectors.

34. The method of claim 25 wherein each element of each modulator output candidate vector has two possible values.

35. The method of claim 25 wherein the look-ahead delta-sigma modulator is a Trellis type delta-sigma modulator.

36. The method of claim 25 wherein the look-ahead delta-sigma modulator is a tree-based delta-sigma modulator.

37. The method of claim 36 wherein each output value represents a leading bit of each modulator output candidate vector associated with each selected identified quantization error vector.

38. The method of claim 36 wherein:
generating each quantization error vector comprises:
generating a first difference vector by determining a difference between one of the M element modulator output candidate vectors and one of the M element modulator input vectors;
filtering the first difference vector; and
generating a second difference vector by determining a difference between one of the M element modulator output candidate vectors and one of the M element first difference vectors.

39. The method of claim 38 wherein generating an output value from the associated modulator output candidate vector comprises identifying the quantization error vector having a lowest cumulative power in comparison to the remaining quantization error vectors.

40. The method of claim 25 wherein the look-ahead delta-sigma modulator is implemented using software.

41. The method of claim 25 wherein the delta-sigma modulator comprises a quantizer, each vector derived from a difference between look-ahead delta-sigma modulator input and output candidate vectors represents a cost value vector, and each cost value vector comprises a difference between an $i^{th}$ quantizer input vector and the $i^{th}$ modulator output candidate vector.

42. The method of claim 41 wherein the $i^{th}$ quantizer input vector comprises a filtered difference between the modulator input vector and the $i^{th}$ modulator output candidate vector.

43. The method of claim 25 further comprising:
   weighting in the time-domain at least two elements of the quantization error vectors with different, non-zero weights.

44. The method of claim 43 wherein weighting in the time-domain at least two elements of the quantization error vectors comprises computing a dot product of each error vector and a weight vector.

45. The method of claim 43 wherein weighting in the time-domain at least two elements of the quantization error vectors comprises weighting with a weight vector having non-zero elements that trend downward as a look-ahead depth of the error values increase.

46. The method of claim 43 wherein weighting in the time-domain at least two elements of the quantization error vectors comprises weighting with a weight vector having non-zero elements that decrease linearly.

47. The method of claim 43 wherein weighting in the time-domain at least two elements of the quantization error vectors comprises weighting with a weight vector having non-zero elements that decrease exponentially.

48. The method of claim 43 wherein weighting in the time-domain at least two elements of the quantization error vectors comprises weighting with a weight vector that includes elements $[w_0, w_1, w_2, w_3, \ldots]$, wherein $w_0, w_1$, and $w_2$ have magnitudes within approximately +/−5% of each other and $w_3$ has a magnitude of approximately 80% or less of the magnitude of one of the previous elements.

49. The method of claim 43 wherein weighting in the time-domain at least two elements of the quantization error vectors comprises weighting with a weight vector having elements that remain the same for each set of M modulator output candidates.

50. The method of claim 25 wherein the generated output comprises r output values, wherein r is any integer between 1 and M.

51. A signal processing system comprising:
   an M-depth delta-sigma modulator to determine output values from respective sets of M element modulator output candidate vectors using quantization error vectors, wherein M is greater than one, each element in the output candidate vectors is a potential output value of the delta-sigma modulator.

52. The signal processing system of claim 51 further comprising:
   a first difference module to determine difference vectors corresponding to a difference between an input vector and the set of delayed modulator output candidate vectors; and
   a digital filter to determine a filter output vector from each difference vector; and
   a second difference module to determine quantization error vectors, wherein the $i^{th}$ quantization error vector corresponds to a difference between an $i^{th}$ filter output vector and an $i^{th}$ modulator output candidate vectors.

53. The signal processing system of claim 51 further comprising:
   a storage medium encoded with the output values.

54. A method of determining an output signal using an M-depth delta-sigma modulator and quantization error vectors, wherein M is greater than one and each element in the output candidate vectors is a potential output value of the delta-sigma modulator, the method comprising:
   processing an input signal vector and a set of delayed output candidate vectors;
   for each processed input signal vector and delayed output candidate vector, computing a quantization error vector from the processed input signal vector and delayed output candidate vector;
   processing each quantization error vector to identify the output candidate vector that best matches the input signal vector; and
   selecting an output from the output candidate vector that best matches the input signal vector.

55. The method of claim 54 wherein processing an input signal vector and a set of delayed output candidate vectors comprises:
   filtering a difference between the input signal vector and the set of delayed output candidate vectors.

56. A method of processing a signal using a delta-sigma modulator, the method comprising:
   determining output values of an M-depth delta-sigma modulator from respective sets of M element modulator output candidate vectors and an M element modulator input vector using quantization error vectors, wherein M is greater than one, each element in the output candidate vectors is a potential output value of the delta-sigma modulator.

* * * * *